United States Patent
de Souza et al.

(10) Patent No.: US 8,138,061 B2
(45) Date of Patent: Mar. 20, 2012

(54) QUASI-HYDROPHOBIC SI-SI WAFER BONDING USING HYDROPHILIC SI SURFACES AND DISSOLUTION OF INTERFACIAL BONDING OXIDE

(75) Inventors: Joel P. de Souza, Putnam Valley, NY (US); John A. Ott, Greenwood Lake, NY (US); Alexander Reznicek, Mount Kisco, NY (US); Devendra K. Sadana, Pleasantville, NY (US); Katherine L. Saenger, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 734 days.

(21) Appl. No.: 11/031,165

(22) Filed: Jan. 7, 2005

(65) Prior Publication Data

US 2006/0154442 A1    Jul. 13, 2006

(51) Int. Cl.
*H01L 21/46* (2006.01)
(52) U.S. Cl. .. 438/455; 438/406; 438/458; 257/E21.497
(58) Field of Classification Search .................. 438/406, 438/455, 458, 459; 257/E21.497
See application file for complete search history.

(56) References Cited

U.S. PATENT DOCUMENTS

| | | | |
|---|---|---|---|
| 7,023,055 B2 | 4/2006 | Ieong et al. |
| 7,285,473 B2 | 10/2007 | de Souza et al. |
| 7,329,923 B2 | 2/2008 | Doris et al. |
| 2004/0087109 A1 | 5/2004 | McCann et al. |
| 2005/0116290 A1 | 6/2005 | de Souza et al. |
| 2006/0154442 A1 | 7/2006 | de Souza et al. |

OTHER PUBLICATIONS

M. Yang, et al. "High Performance CMOS Fabricated on Hybrid Substrate with Different Crystal Orientations," IEDM 2003 Paper 18.7.
P. McCann, et al. "An investigation into interfacial oxide in direct silicon bonding," 6th Int. Symp. on Semiconductor Wafer Bonding, San Francisco, Sep. 2-7, 2001.
K.-Y. Ahn, et al. "Stability of interfacial oxide layers during silicon wafer bonding," J. Appl. Phys. 65 561 (1989).
Notice of Allowance dated Jun. 27, 2011 received in a related application, namely U.S. Appl. No. 12/538,115.

*Primary Examiner* — Jack Chen
(74) *Attorney, Agent, or Firm* — Scully, Scott, Murphy & Presser, P.C.; Louis J. Percello, Esq.

(57) ABSTRACT

The present invention provides a method for removing or reducing the thickness of ultrathin interfacial oxides remaining at Si—Si interfaces after silicon wafer bonding. In particular, the invention provides a method for removing ultrathin interfacial oxides remaining after hydrophilic Si—Si wafer bonding to create bonded Si—Si interfaces having properties comparable to those achieved with hydrophobic bonding. Interfacial oxide layers of order of about 2 to about 3 nm are dissolved away by high temperature annealing, for example, an anneal at 1300°-1330° C. for 1-5 hours. The inventive method is used to best advantage when the Si surfaces at the bonded interface have different surface orientations, for example, when a Si surface having a (100) orientation is bonded to a Si surface having a (110) orientation. In a more general aspect of the invention, the similar annealing processes may be used to remove undesired material disposed at a bonded interface of two silicon-containing semiconductor materials. The two silicon-containing semiconductor materials may be the same or different in surface crystal orientation, microstructure (single-crystal, polycrystalline, or amorphous), and composition.

9 Claims, 7 Drawing Sheets

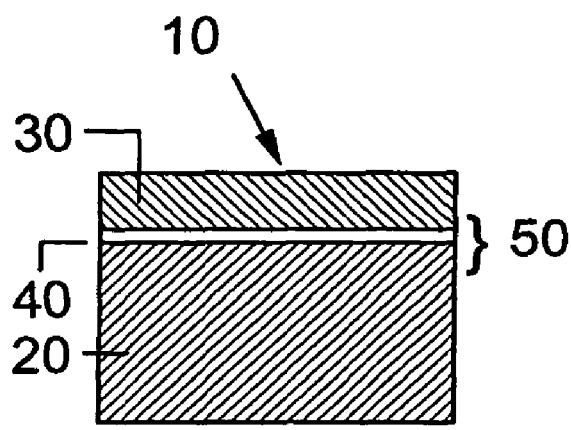
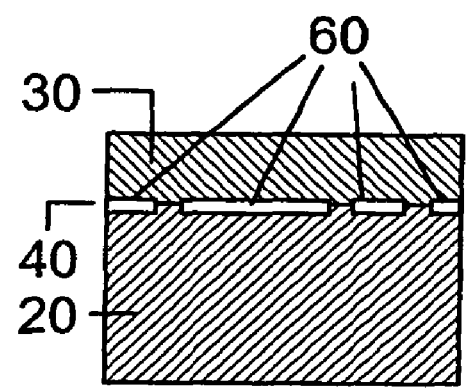
FIG. 1A FIG. 1B
PRIOR ART

QUASI-HYDROPHOBIC SI-SI WAFER BONDING USING HYDROPHILIC SI SURFACES AND DISSOLUTION OF INTERFACIAL BONDING OXIDE

RELATED APPLICATIONS

This application is related to Ser. No. 11/031,142 entitled "Method For Fabricating Low-Defect Density Changed Orientation Si", which application is being filed on the same date as the present application.

FIELD OF THE INVENTION

The present invention generally relates to semiconductor wafer bonding, and more particularly to methods of silicon-to-silicon, i.e., Si—Si, wafer bonding in which two wafers having different Si surface orientations are joined and processed in such a manner as to produce a bonding interface that is clean and substantially free of any interfacial oxide.

BACKGROUND OF THE INVENTION

Semiconductor device technology is increasingly relying on specialty Si-based substrates to improve the performance of complementary metal oxide semiconductor (CMOS) devices, such as nFETs (i.e., n-channel MOSFETs) or pFETs (i.e., p-channel MOSFETs). For example, the strong dependence of carrier mobility on silicon orientation has led to increased interest in hybrid orientation Si substrates in which nFETs are formed in (100)-oriented Si (the orientation in which electron mobility is higher) and pFETs are formed in (110)-oriented Si (the orientation in which hole mobility is higher), as described, for example, by M. Yang, et al. "High Performance CMOS Fabricated on Hybrid Substrate with Different Crystal Orientations," IEDM 2003 Paper 18.7 and U.S. patent application Ser. No. 10/250,241, filed Jun. 17, 2003 entitled "High-performance CMOS SOI devices on hybrid crystal-oriented substrates".

While there are a variety of approaches for fabricating hybrid orientation substrates, all share a fundamental requirement for some type of bonding and layer transfer to produce regions of semiconductor with a first orientation (derived from a first semiconductor wafer) and regions of semiconductor with a second orientation (derived from a second semiconductor wafer).

Most Si wafer bonding techniques utilize hydrophilic bonding, in which an oxide (or native oxide) is disposed on both of the wafer surfaces to be bonded. Hydrophilic bonding is a suitable approach when an oxide is desired at the bonded interface (for example, when fabricating silicon-on-insulator (SOI) substrates). However, some applications require direct Si-to-Si bonding, with no oxide layer at the bonded interface. For example, fabrication of hybrid orientation substrates by amorphization/templated recrystallization (ATR) methods such as described, for example, by U.S. patent application Ser. No. 10/725,850, filed Dec. 2, 2003 entitled "Planar substrate with selected semiconductor crystal orientations formed by localized amorphization and recrystallization of stacked template layers" requires a clean Si/Si interface between Si surfaces having different surface orientations (e.g., (110) Si and (100) Si).

Such direct Si-to-Si bonding is normally achieved with hydrophobic bonding, a more difficult and less well developed technique than the more commonly used hydrophilic bonding. Hydrophobic bonding is a relatively difficult technique for several reasons. Hydrophobic (H-terminated) surfaces are more easily contaminated than hydrophilic ones, often leading to a choice to perform hydrophobic bonding in a vacuum environment. In addition, the widely used surface plasma treatments developed to allow room temperature bonding typically introduce surface oxygen, making them incompatible with an oxide-free bonded interface. Bonding at higher temperatures also can present difficulties, since most cleaving processes (used to separate the bonded layer from the wafer to which it was originally attached) are thermally activated and start occurring in the same temperature range as the bonding.

Direct Si-to-Si wafer bonding could be greatly simplified if one had a "quasi-hydrophobic" bonding method in which an ultrathin (1-2 nm) oxide would be present on one or both wafer surfaces during bonding (allowing the bonding to be hydrophilic), but made to disappear by removing it after the bonding to leave the desired direct Si-to-Si contact at the bonded interface.

The dissolution and/or islanding of buried oxide layers between bonded Si wafers has been examined previously as a function of Si wafer doping, Si wafer growth (float-zone (FZ) or Czochralski (Cz)), and Si wafer surface orientation. Both P. McCann, et al. "An investigation into interfacial oxide in direct silicon bonding," 6th Int. Symp. on Semiconductor Wafer Bonding, San Francisco, Sep. 2-7, 2001, and K.-Y. Ahn, et al. "Stability of interfacial oxide layers during silicon wafer bonding," J. Appl. Phys. 65 561 (1989) utilized $N_2$ annealing at temperatures in the range from 1100°-1200° C. It was concluded that dissolution of native oxides having a thickness greater than 1 nm is not possible, and that undesirable oxide islanding is typical, especially with Cz wafers.

An example of this islanding is shown schematically in FIGS. 1A-1B. FIG. 1A shows a cross section view of a bonded structure 10 before an anneal that produces islanding. Bonded structure 10 in FIG. 1A comprises a substrate silicon wafer 20, a bonded silicon layer 30, and a continuous oxide layer 40 at an interface 50. After annealing, the oxide layer 40 breaks up into islands 60, as shown in FIG. 1B.

In contrast to these results, it was shown that a few monolayers of interfacial oxide could be made to disappear in FZ wafers after annealing at 1150° C. Unfortunately, FZ wafers are still very expensive, are relatively easily deformed during processing, and typically are used only in cases where high resistivity substrates are required. Moreover, it is expected that interfacial oxide layers will never be as thin as a few monolayers, if the bonding is done in any environment other than high vacuum.

In view of the above, it would be desirable to have a method for removing the ultrathin interfacial oxide remaining at the Si—Si interface after bonding. More particularly, it would be desirable to have a method for removing ultrathin interfacial oxides remaining after hydrophilic Si—Si wafer bonding to create bonded Si—Si interfaces having properties comparable to those achieved with hydrophobic bonding.

SUMMARY OF THE INVENTION

An object of the present invention is to provide a method for removing an ultrathin interfacial oxide (on the order from about 0.5 to about 4 nm) remaining after hydrophilic Si—Si wafer bonding, thereby allowing formation of a Si—Si interface comparable to those achieved with hydrophobic bonding with the convenience of hydrophilic bonding.

Another object of the present invention is to provide a method for thinning or removing undesired material disposed at a bonded interface between two silicon-containing semiconductor materials.

A further object of the present invention is to provide a method for forming a Si layer-to-Si wafer bonded wafer couple in which the Si-to-Si interface is both oxide-free and formed by hydrophilic bonding.

The first-mentioned object of the present invention is achieved by an oxide dissolution process in which a bonded Si—Si interface including an ultrathin oxide layer is annealed at an elevated temperature (e.g., from about 1200° to about 1400° C.) in an ambient for a time long enough to dissolve the oxide (e.g., 1 min to about 24 hours). Specifically, a bonded structure comprising a first Si material and a second Si material separated by an ultrathin oxide layer is provided and then the bonded structure is annealed at a temperature sufficient to dissolve oxide, yet not melt the Si materials.

The ultrathin oxide layer at the bonded Si—Si interface would typically have an initial thickness of about 2 to about 3 nm. The oxide layer might comprise (or be derived from) a native silicon oxide, a chemical oxide (e.g., as produced by a wet chemical clean), a thermally grown oxide, an oxide deposited by chemical vapor deposition, or an oxide formed as the result of a plasma treatment.

Regarding the more general object of this invention, a similar annealing process may be used to thin or remove undesired material disposed at a bonded interface between two silicon-containing semiconductor materials. For example, the similar annealing process might be used to remove an O-containing material from the interface between two SiGe layers.

Regarding the final object of the present invention, a method is provided to form a bonded Si layer-to-Si wafer couple in which the Si-to-Si interface is oxide-free yet formed by bonding of hydrophilic Si surfaces. The steps of the this embodiment of the present invention include:

selecting a handle wafer with a Si surface to be bonded;

selecting a donor wafer with a Si surface to be bonded, the donor wafer preferably including a cleave plane or etch-stop region at some predetermined depth from the donor wafer surface;

subjecting the bonding surfaces of the two wafers to cleaning and surface treatments known to the art, leaving the bonding surfaces hydrophilic without introducing more than about 3 to about 5 nm of oxide on either bonding surface;

bonding the wafers by methods known to the art;

removing undesired portions of the donor wafer to leave a transferred donor wafer layer;

performing surface treatments on the transferred donor wafer layer, as necessary, to leave the bonded donor wafer layer with the desired surface finish and thickness; and performing the novel oxide dissolution process of this invention to remove the interfacial material remaining at the bonded interface.

It should be noted that the aspect of the present invention relating to Si-to-Si bonding is used to best advantage when the Si surfaces at the bonded interface have different surface orientations, for example, when a Si surface having a (100) orientation is bonded to a Si surface having a (110) orientation.

BRIEF DESCRIPTION OF THE DRAWINGS

FIGS. 1A-1B are pictorial representations (through cross sectional views) illustrating a bonded silicon-to-silicon interface before (FIG. 1A) and after (FIG. 1B) a prior art attempt to remove an interfacial oxide layer.

DETAILED DESCRIPTION OF THE INVENTION

Figure 2A:
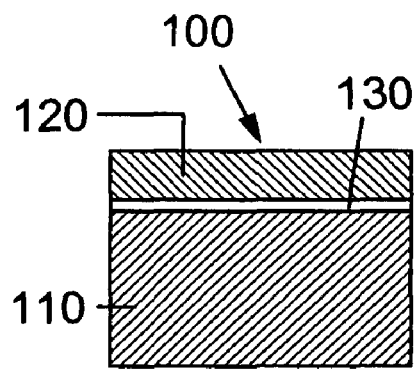
FIGS. 2A-2B are pictorial representations (through cross sectional views) illustrating the various processing steps of the inventive oxide dissolution process for removing or reducing the thickness of an interfacial oxide between two bonded silicon surfaces.

The present invention will now be described in more detail by referring to the drawings that accompany the present application. In the accompanying drawings, like and corresponding elements are referred to by like reference numerals. It is also noted that the drawings of the present invention representing the structures during the various processing steps of the present invention are provided for illustrative purposes and are thus not drawn to scale.

Figure 2B:
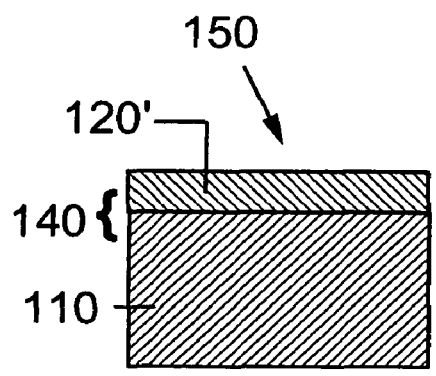

Reference is first made to FIGS. 2A-2B which show a cross section schematic view of the initial and final steps of the inventive oxide dissolution process for removing or reducing the thickness of an interfacial oxide between two bonded silicon surfaces for the case where the two silicon surfaces have different surface orientations. The difference surface orientations can include, for example, any major or minor axis of a Si wafer. FIG. 2A shows a starting structure 100 comprising Si layer or handle wafer 110 having a first orientation, a silicon-on-insulator (SOI) layer 120 having a second orientation different from the first orientation, and an ultrathin buried oxide (box) layer 130 separating elements 110 and 120. Ultrathin oxide layer 130 would typically be less than 5 nm thick. Starting structure 100 is then exposed to the oxide dissolution process of this invention to produce structure 150 of FIG. 2B with oxide-free interface 140, and final Si layer 120', which may in some cases be thinner than the initial Si layer 120.

Figure 3A:
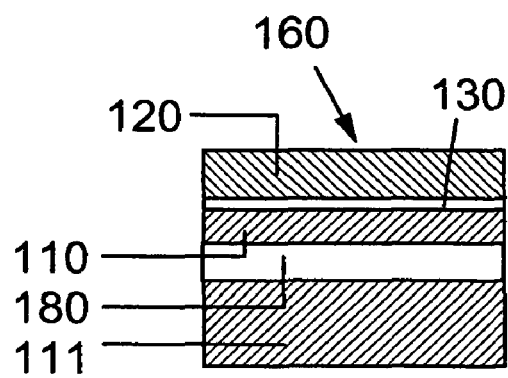
FIGS. 3A-3B are pictorial representations (through cross sectional views) illustrating the various processing steps of the inventive oxide dissolution process for the case in which one of the bonded silicon surfaces is disposed on a buried oxide layer.
Figure 3B:
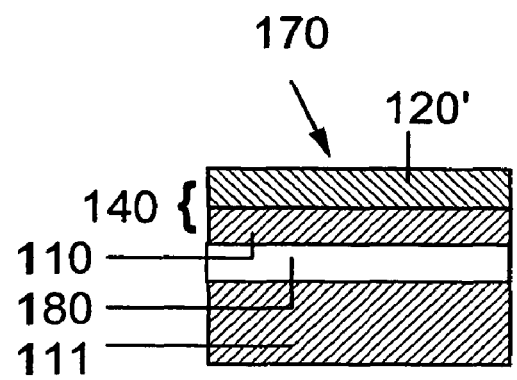

FIGS. 3A-3B show the initial and final steps of the inventive oxide dissolution process for the case in which one of the bonded silicon surfaces is disposed on a moderately thick buried oxide or other insulating layer 180 on handle wafer 111. Structures 160 and 170 of FIGS. 3A and 3B are analogous to structures 100 and 150 of FIGS. 2A and 2B. As described in Ser. No. 10/725,850, structures such as 170 of FIG. 3B can be useful as a starting substrate for fabricating SOI hybrid orientation substrates by certain ATR methods. Buried oxide layer 180 typically has a thickness from about 100 to about 200 nm. The inventive oxide dissolution process will cause some thinning of layer 180, but it is less consequential (because thickness changes of around 3 nm are a small fraction of buried oxide layer 180's initial thickness).

The different surface orientations of silicon layer or handle wafer 110 and SOI layer 120 may be selected from (100), (110), (111), and the like.

Figure 4A:
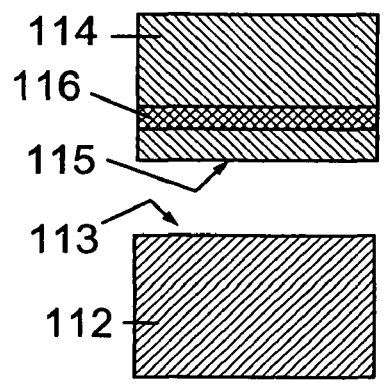
FIGS. 4A-4E are pictorial representations (through cross sectional views) illustrating how the oxide dissolution process of the present invention may be incorporated into a hydrophilic Si-to-Si bonding method to produce a wafer structure with bonded Si—Si interfaces having properties comparable to those achieved with hydrophobic bonding.
Figure 4B:
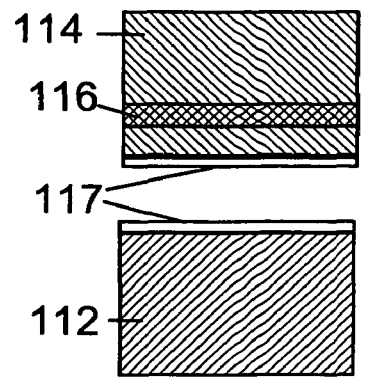
Figure 4C:
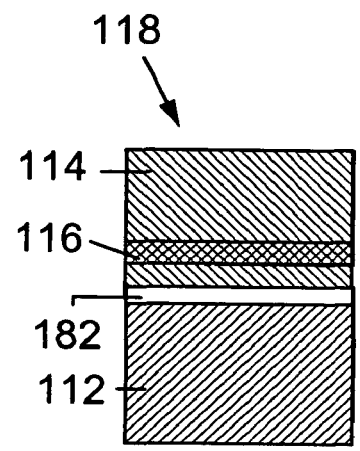
Figure 4D:
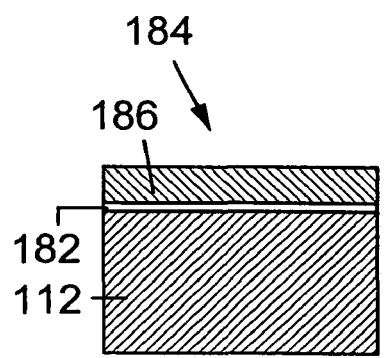
Figure 4E:
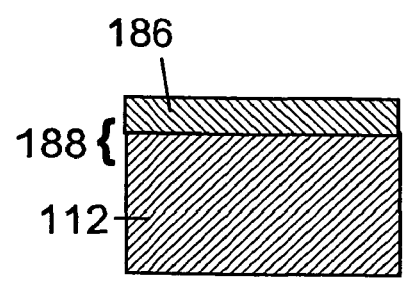

FIGS. 4A-4E show how the oxide dissolution annealing process of the present invention can be incorporated into a hydrophilic Si-to-Si bonding method to produce a wafer structure with bonded Si—Si interfaces having properties comparable to those achieved with hydrophobic bonding. FIG. 4A shows a handle wafer 112 with a Si bonding surface 113, and a donor wafer 114 with a Si bonding surface 115 and an optional cleave plane or etch-stop region 116. FIG. 4B shows the wafers of FIG. 4A after cleaning and surface treatments which leave the bonding surfaces hydrophilic and with surface oxide layers 117 that are less than about 3 to about 5 nm thick. FIG. 4C shows the wafers of FIG. 4B after bonding. A bonded wafer couple 118 with combined interfacial oxide layer 182 is then produced by using bonding methods known to the art (see for example, Q.-Y. Tong and U. Gosele, Semiconductor Wafer Bonding Science and Technology, John Wiley (New York, 1999), or U.S. patent application Ser. No. 10/696,634; the entire content of each is incorporated herein by reference). FIG. 4D shows the structure of FIG. 4C after undesired portions of the donor wafer have been removed to leave a structure 184 with a transferred donor wafer layer 186. The oxide dissolution process of the present invention is then used to remove interfacial material remaining at the bonded interface to produce the structure of FIG. 4E with an oxide-free interface 188.

It should be noted that handle and donor wafers 112 and 114 may include subsurface insulating or semiconductor layers or other structures not shown in FIG. 4A. It should also be noted that the transferred donor wafer layer 186 may be subjected to surface treatments as necessary to leave the layer with the desired surface finish and thickness, and that various anneals may be performed after bonding to improve bond strength.

FIGS. 5 and 6 show the intermediate steps of the oxide dissolution annealing process used in FIGS. 2-4. FIG. 5 is for the case in which the oxide dissolution anneal is performed in a mildly oxidizing annealing ambient without a protective cap layer, and FIG. 6 is for the case in which the oxide dissolution anneal is performed in an inert annealing ambient after deposition of a protective cap layer.

In both cases, the oxide dissolution anneal of the invention is preferably performed at a temperature in the range from about 1200° to about 1400° C., in an ambient for a time duration in the range from about 1 min to about 24 hours. More preferably, the anneal is performed at a temperature in the range from about 1300° to about 1330° C., in an atmospheric-pressure ambient for a time duration of about 1 to about 5 hours. Ramp rates are preferably in the range from about 0.1 to about 10° C./min, with ramp rates at the lower end of this range preferred for temperatures above 1200° C.

Figure 5A:
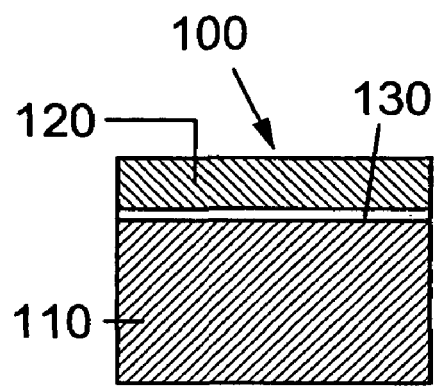
FIGS. 5A-5C are pictorial representations (through cross sectional views) illustrating intermediate steps of the inventive oxide dissolution process for the case in which the interfacial oxide is removed in a mildly oxidizing annealing ambient in the absence of a protective cap layer.
Figure 5B:
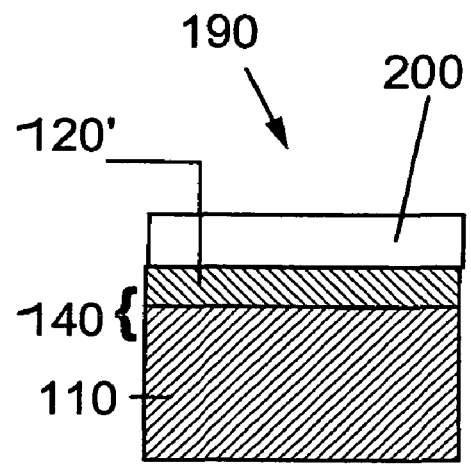
Figure 5C:
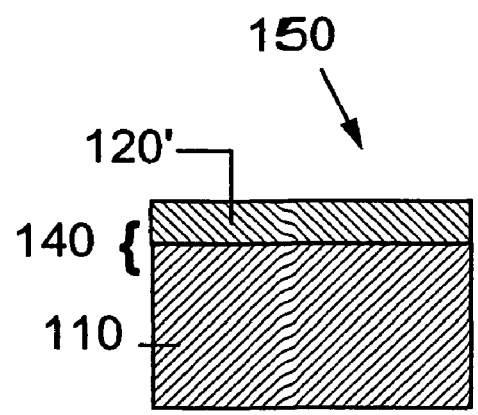

FIGS. 5A-5C illustrate the inventive oxide dissolution annealing process for the case of no protective cap layer. FIG. 5A shows the starting structure 100 of FIG. 2A before annealing. FIG. 5B shows structure 100 of FIG. 5A after annealing in a mildly oxidizing ambient in the above-described preferred time/temperature range to produce structure 190 with an oxide-free interface 140, a thinned Si layer 120', and a reaction layer 200 resulting from reactions of the Si layer 120 with oxygen or other reactive species in the annealing ambient. Reaction layer 200, typically comprising $SiO_2$, may then be removed by any process known to the art (e.g., wet etching in an HF-containing solution) to form structure 150 of FIGS. 2B and 5C.

Trace amounts of $O_2$ are typically deliberately incorporated into the annealing ambient to prevent pitting of exposed Si surfaces. Too low an oxygen concentration will lead to Si roughening and pitting via the formation and desorption of volatile Si suboxides (e.g., SiO). Too high an oxygen concentration in the ambient will lead to the formation of a thick surface $SiO_2$ layer and substantial Si consumption. Addition of oxygen in the range from about 0.02 to about 2% $O_2$ allows the formation of a uniform, very slowly growing $SiO_2$ layer which keeps the Si surface relatively smooth.

Figure 6A:
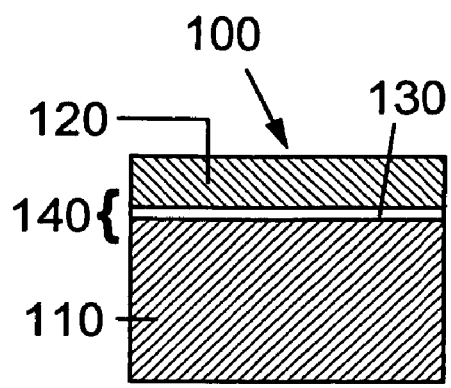
FIGS. 6A-6D are pictorial representations (through cross sectional views) illustrating intermediate steps of the inventive oxide dissolution process for the case in which the interfacial oxide is removed in an inert or mildly oxidizing annealing ambient after deposition of a protective cap layer.
Figure 6B:
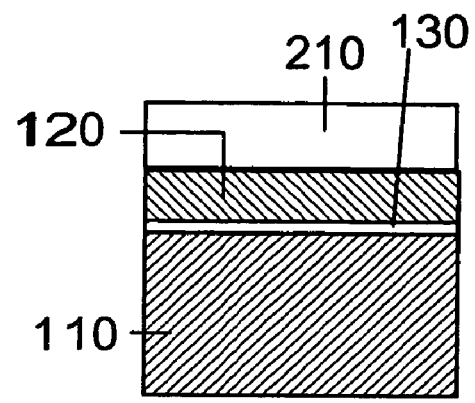
Figure 6C:
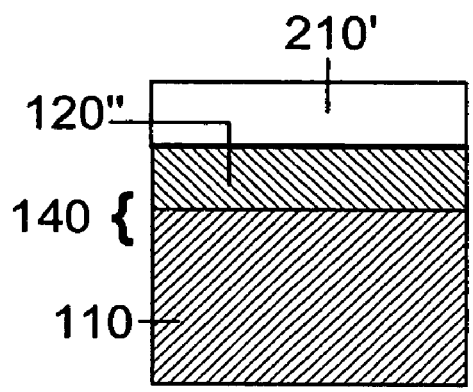
Figure 6D:
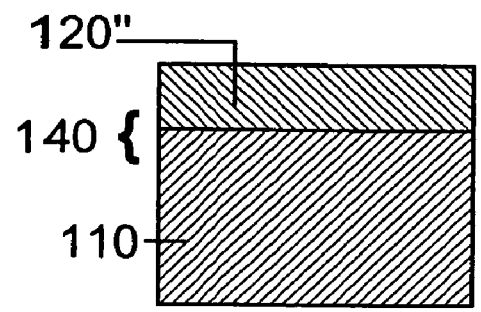

Protective cap layers may be used to minimize or eliminate silicon consumption during the annealing process of the present invention, as shown in FIGS. 6A-6D. FIG. 6A shows the starting structure 100 of FIG. 2A before annealing. FIG. 6B shows structure 100 of FIG. 6A after deposition of protective cap layer 210. The structure of FIG. 6B is then annealed in an inert or mildly oxidizing ambient in the above-described preferred time/temperature range to dissolve away the ultrathin oxide layer 130, producing the structure of FIG. 6C, with an oxide-free interface 140, a negligibly thinned Si layer 120'', and possibly an at-least-partially-oxidized protective cap layer 210'. Cap layer 210' is then removed after the anneal to produce the structure of FIG. 6D.

Protective cap layer 210 would typically comprise one or more layers of deposited materials that are thermally stable, non-reactive with respect to the underlying semiconductor regions, and easy to selectively remove after the anneal. Preferred materials for a deposited protective cap layer include one or more layers selected from the group of materials including $SiO_2$, $SiN_x$, or $SiO_xN_y$, Si (amorphous, polycrystalline or single crystalline). Protective cap layer thicknesses are preferably in the range from about 30 to about 500 nm.

The need for an oxidizing ambient for the high temperature annealing step is lessened with the use of a protective cap layer. As mentioned above, some $O_2$ is normally deliberately added to the annealing ambient, to tilt the $SiO_2(s)$-$SiO(s)$-$SiO(g)$ equilibrium towards $SiO_2(s)$ formation and away from $SiO(g)$ desorption (which can lead to etching and pitting of the Si surface). Both $SiO_2$ and $SiN_x$ cap layers protect the Si surface by interfering with the adsorption of oxygen and the desorption of any SiO resulting from the substrate Si oxidation. However, $SiN_x$ cap layers are potentially less volatile than $SiO_2$, since $SiO_2$ can react with oxygen-containing species in the ambient to form $SiO(g)$ and (if H-containing gases are present in the ambient) other volatile species such as $SiO_xH_y$. But $SiN_x$ layers are vulnerable to at least some surface oxidation, and formation of some $SiO_xN_y$ is expected even in ambients without deliberately added $O_2$.

Several preferred protective cap layers will be described below, along with their advantages and disadvantages:

(A) Substrate/$SiO_2$. A preferred protective cap layer might comprise a thick (on the order of about 50 to about 500 nm) layer of $SiO_2$. Such a cap layer has the advantage of being simple and effective. However, $SiN_x$ layers can be better diffusion barriers to oxygen, and, as mentioned above, oxide caps are still susceptible to thinning.

(B) Substrate/$SiO_2$/SiN. A preferred bilayer protective cap might comprise a thin (on the order of about 5 to about 20 nm) bottom layer of $SiO_2$ in combination with a thicker (on the order of about 50 to about 200 nm) $SiN_x$ overlayer. After the anneal, surface $SiO_xN_y$ formed by oxidation of the $SiN_x$ overlayer can be removed by etching in dilute HF, and the remaining $SiN_x$ overlayer can be easily selectively etched with respect to the underlying $SiO_2$ in hot phosphoric acid. However, high annealing temperatures can lead to undesired mixing of the oxide underlayer with the nitride overlayer to form the oxynitride $Si_2N_2O$ (or one of similar composition), which is insoluble in both HF and hot phosphoric acid. This problem can be overcome by etching in HF-ethylene glycol solutions which has roughly equal rates for nitrides, oxides and oxynitrides. In contrast to the $Si_2N_2O$ oxynitride, the surface $SiO_xN_y$ formed by reaction of $SiN_x$ with $O_2$ is readily removed in dilute HF at roughly the rate of a thermal $SiO_2$ oxide (C) Substrate/$SiO_2$/Si. A preferred bilayer protective cap might comprise a thin bottom layer of $SiO_2$ in combination with a thicker overlayer of polycrystalline or amorphous silicon. The uppermost portion of the deposited Si is converted to an oxide layer during the anneal. This oxide is removed by HF, the Si can be removed by any number of etches that are selective to oxide, e.g., tetra-methyl ammonium hydroxide (TMAH), various reactive ion and/or plasma processes, etc. The remaining thin $SiO_2$ layer on the substrate may then removed by HF. Thicknesses for the bottom layer need to be significantly higher than about 5 to about 10 nm in order to allow for the expected thickness reduction resulting from oxide dissolution into the overlying polycrystalline Si. Preferred layer thicknesses might be from about 20 to about 50 nm for the thin $SiO_2$, and about 100 to about 200 nm for the poly-Si overlayer.

(D) Substrate/$SiO_2$/Si/$SiO_2$. A preferred protective cap might comprise a thin (on the order from about 20 to about 50 nm) bottom layer of $SiO_2$ in combination with a thicker (on the order from about 50 to about 100 nm) overlayer of polycrystalline or amorphous silicon, followed by a top layer of $SiO_2$. The top layer of $SiO_2$ reduces the required thickness of Si as well as the amount of silicon oxidation. As with the $SiO_2$/Si protective cap described above in (C), it is best not to make the bottom $SiO_2$ layer too thin.

In general, the annealing ambient may comprise vacuum or at least one gas selected from the group including Ar, He, Kr, Ne, Xe, $N_2$, $O_2$, $H_2$, H-containing gases, C-containing gases, F-containing gases, Cl-containing gases, Si-containing gases, halogen-containing gases, O-containing gases, and mixtures thereof.

The ultrathin oxide layer at the bonded Si—Si interface would typically have a thickness of about 0.5 to about 4 nm, with thicknesses in the range of about 2 to about 3 nm being more typical. The oxide layer might comprise (or be derived from) a native silicon oxide, a chemical oxide (e.g., as produced by a wet chemical clean), a thermally grown oxide, an oxide deposited by chemical vapor deposition, or an oxide formed as the result of a plasma treatment. The oxide layer may further include other elements in addition to silicon and oxygen, such as, for example, one or more elements comprising C, Cl, F, Ge, H, N, S, As, B, P, Sb or Sn.

A more general aspect of this invention pertains to using the above-described high temperature annealing to remove or reduce the thickness of undesired material disposed at a bonded interface of two silicon-containing semiconductor materials. The undesired material may comprise a layer containing at least one element comprising C, Ge, N, O or Si, for example, a silicon oxide, nitride or oxynitride. The two silicon-containing semiconductor materials may be the same or different in surface crystal orientation, microstructure (single-crystal, polycrystalline, or amorphous), and composition. SiGe alloys are one example of Si-containing semiconductor materials falling within the scope of this invention; others include SiC and SiGeC, as well as any of the aforementioned Si-containing materials including at least one dopant.

The inventive method is used to best advantage when the Si surfaces at the bonded interface have different surface orientations, for example, when a Si surface having a (100) orientation is bonded to a Si surface having a (110) orientation. In a more general aspect of the invention, the similar annealing processes may be used to remove undesired material disposed at a bonded interface of two silicon-containing semiconductor materials. The two silicon-containing semiconductor materials may be the same or different in surface crystal orientation, microstructure (single-crystal, polycrystalline, or amorphous), and composition.

The following example is provided to illustrate the present invention and to demonstrate the efficacy of the same.

EXAMPLE

This example illustrates how the method of the present invention was used to remove an interfacial oxide present at the bonded interface between a (100)-oriented Si layer and a (110)-oriented Si handle wafer. Interfacial oxide removal was established by comparing transmission electron micrograph (TEM) images (FIG. 7) and optical reflectance data (FIG. 8) before and after annealing.

Figure 7A:
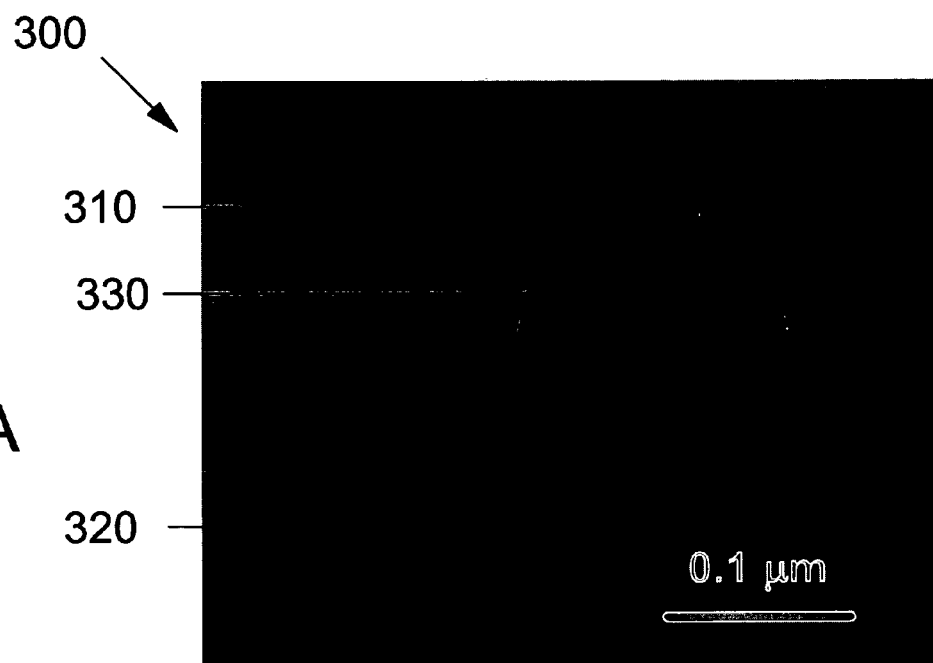
FIGS. 7A-7B show cross section view transmission electron micrographs (TEMs) of a bonded interface before (FIG. 7A) and after (FIG. 7B) the annealing treatment of the present invention.

FIG. 7A shows a TEM image of a substrate structure 300 analogous to 100 of FIG. 2A or 5A, with (110)-oriented Si handle wafer 320, (100)-oriented Si layer 310 having a thickness of 160 nm, and interfacial oxide layer 330 having a thickness of 2-3 nm remaining after a 2 hour bonding anneal at 1000° C. The gray-scale color contrast between Si layer 310 and Si handle wafer 320 results from the difference in their crystal orientations.

Figure 8A:
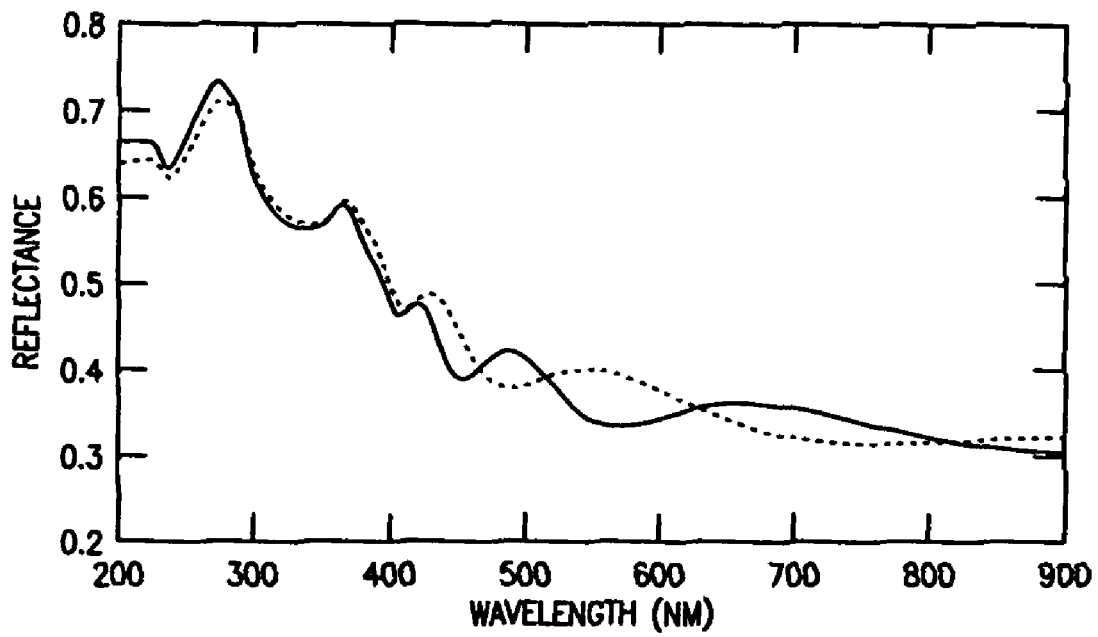
FIG. 8A-8B show reflectance vs. wavelength data for the samples of FIGS. 7A-7B.

The solid trace in FIG. 8A shows reflectance vs. wavelength data for the substrate structure 300. The oscillations in the wavelength range 400-800 nm (absent from the dotted trace of FIG. 8B for a bulk (100)-oriented Si wafer) indicated the presence of a buried oxide layer.

Substrate structure 300 was then subjected to an anneal comprising the following steps:
250°-950° C., 5° C./min, Ar+1.2% $O_2$
950°-1200° C., 3° C./min, Ar+0.13% $O_2$
1200°-1325° C., 1° C./min, Ar+0.063% $O_2$
1325° C./5 h, Ar+0.063% $O_2$
1325°-1200° C., −3° C./min, Ar+0% $O_2$
1200°-400° C., −5° C./min, $N_2$ The anneal produced about 80 nm of surface oxide, corresponding to a silicon consumption of about 36 nm.

Figure 7B:
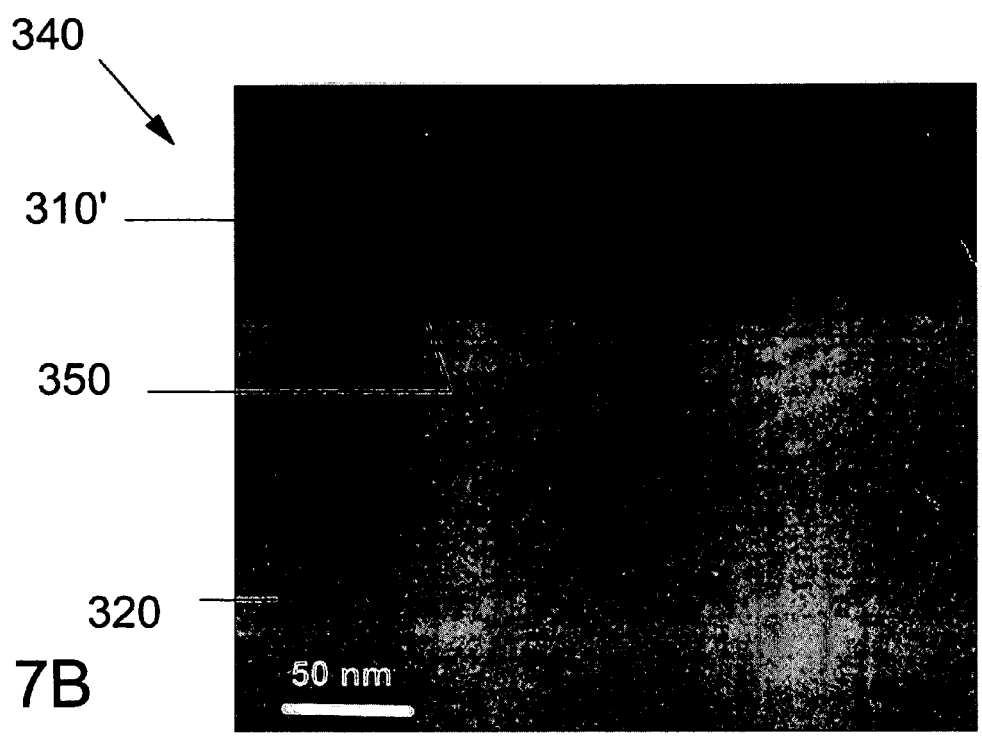

FIG. 7B shows a TEM image of substrate structure 300 after annealing and surface oxide removal by aqueous HF produces substrate structure 340. Interfacial oxide 330 was gone, leaving an array of planar stacking faults 350 at the interface between differently oriented silicon regions 310' and 320. Surface Si layer 310' was slightly thinner than original layer 310, and handle wafer 320 remained the same.

Figure 8B:
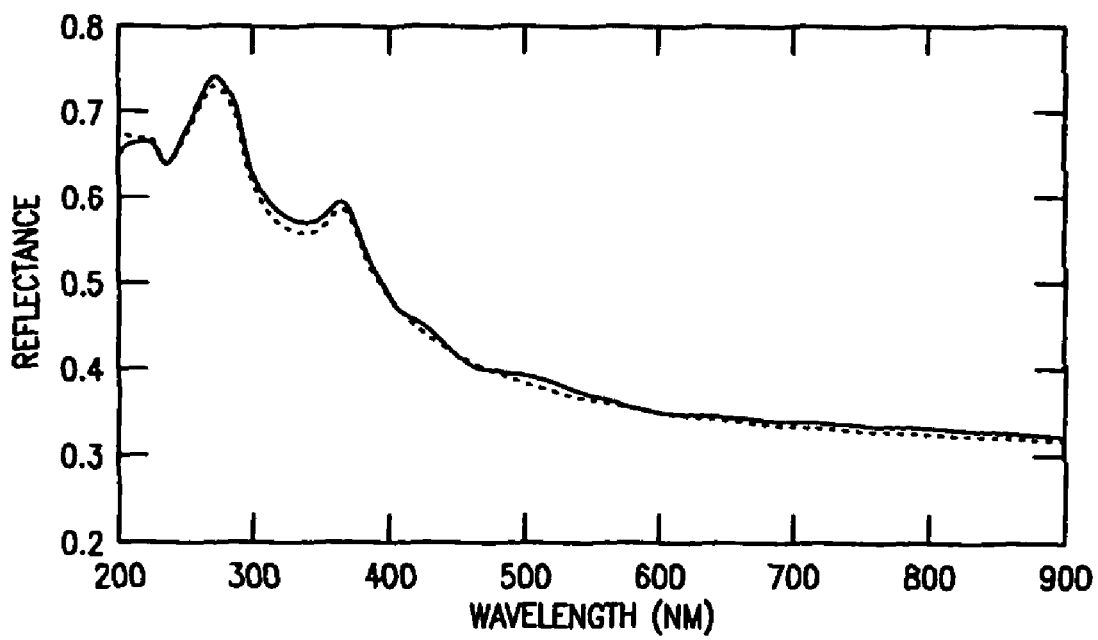

The solid trace of FIG. 8B shows reflectance vs. wavelength data for substrate structure 340. Oscillations in the wavelength range 400-800 nm were nearly absent, and the trace was nearly identical to the dotted trace for a bulk (100)-oriented Si wafer. While less definitive than the TEM data of FIG. 7B, this was at least suggestive of a very substantial reduction in interfacial oxide thickness. It should be noted that the thickness difference between layers 310 and 310' was not enough to account for the decreased oscillation amplitude, since strong oscillations were still present in the dotted trace of FIG. 8A for a sample formed from substrate 300 by simply thinning layer 310 to the thickness of layer 310' (without affecting interfacial oxide 330).

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a semiconductor structure comprising:
    forming a bonded structure by bonding two silicon surfaces to each other through an interfacial oxide layer that is present on each of the two silicon surfaces, wherein each interfacial oxide layer has a thickness ranging from 3 nm to 5 nm; and
    annealing the bonded structure including the interfacial oxide layer that is present on each of the two silicon surfaces in an ambient that consists essentially of argon and oxygen, wherein oxygen is present in an amount from about 0.02 to about 2% at a temperature ranging from 250° C. to 1325° C., wherein said annealing completely removes said interfacial oxide layer from said bonded structure thereby said two silicon surfaces are directly bonded together without any oxide islands or oxide layer being present between the two silicon surfaces.

2. The method of claim 1 wherein said two silicon surfaces comprise a first silicon surface with a first single crystal surface orientation and a second silicon surface with a second single crystal surface orientation, said second single crystal surface orientation is different from said first single crystal surface orientation.

3. The method of claim 2 wherein said first and second single crystal surface orientations comprise (100), (110) or (111) surface orientations.

4. The method of claim 1 wherein said interfacial oxide is an oxide comprising silicon and oxygen.

5. The method of claim 1 wherein said annealing is performed at said temperature for a time period from about 0.1 to about 24 hours.

6. The method of claim 1 wherein said ambient further comprises at least one gas selected from the group consisting of Ar, He, Kr, Ne, Xe, $N_2$, $H_2$, H-containing gases, C-containing gases, F-containing gases, Cl-containing gases, Si-containing gases, halogen-containing gases, and mixtures thereof.

7. The method of claim 1 further comprising depositing a disposable protective cap layer before said annealing and removing said disposable protective cap layer after said annealing.

8. The method of claim 1 further comprising removing any surface oxide layer produced during said annealing.

9. The method of claim 8 wherein said removing comprises a wet etch containing hydrofluoric acid (HF).

* * * * *